United States Patent
Kraipak et al.

(10) Patent No.: US 8,806,140 B1
(45) Date of Patent: Aug. 12, 2014

(54) DYNAMIC MEMORY MODULE SWITCHING WITH READ PREFETCH CACHING

(75) Inventors: Waseem Saify Kraipak, Maharashtra (IN); George Bendak, San Diego, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 1118 days.

(21) Appl. No.: 12/784,542

(22) Filed: May 21, 2010

Related U.S. Application Data

(63) Continuation-in-part of application No. 12/763,110, filed on Apr. 19, 2010, which is a continuation-in-part of application No. 12/729,210, filed on Mar. 22, 2010, now Pat. No. 8,438,358, which is a continuation-in-part of application No. 12/687,817, filed on Jan. 14, 2010, which is a continuation-in-part of application No. 12/639,064, filed on Dec. 16, 2009.

(51) Int. Cl.
*G06F 12/00* (2006.01)

(52) U.S. Cl.
USPC .......................... 711/137; 711/103; 711/170

(58) Field of Classification Search
USPC .......................... 711/137, 170, 103
See application file for complete search history.

(56) References Cited

U.S. PATENT DOCUMENTS

| | | | |
|---|---|---|---|
| 6,338,119 B1 * | 1/2002 | Anderson et al. | 711/135 |
| 7,100,013 B1 * | 8/2006 | de Waal | 711/170 |
| 2005/0235131 A1 * | 10/2005 | Ware | 711/203 |

* cited by examiner

*Primary Examiner* — Kalpit Parikh
(74) *Attorney, Agent, or Firm* — Amin, Turocy & Watson, LLP

(57) ABSTRACT

A system and method are provided for using a system-on-chip (SoC) memory manager to optimize the use of off-chip memory modules. A SoC memory controller receives a request for a first data block, subsequent to shutting the first memory down, and determines that the first data block is stored in the first memory. A SoC memory switching core uses a memory map to translate the first data block address in the first memory module to a first data block address in the second memory module. If the first data block is present in an on-SoC cache, the first data block is supplied on the SoC data bus from the cache. Then, the cache is loaded with a plurality of data blocks from a corresponding plurality of addresses in the second memory module, associated with the first data block address.

18 Claims, 6 Drawing Sheets

DYNAMIC MEMORY MODULE SWITCHING WITH READ PREFETCH CACHING

RELATED APPLICATIONS

This application is a Continuation-in-Part of a pending application entitled, SYSTEM-ON-CHIP WITH DYNAMIC MEMORY MODULE SWITCHING, invented by Waseem Kraipak et al., Ser. No. 12/763,110, filed Apr. 19, 2010;

which is a Continuation-in-Part of a application entitled, SYSTEM-ON-CHIP WITH MEMORY SPEED CONTROL CORE, invented by Waseem Kraipak et al., Ser. No. 12/729,210, filed Mar. 22, 2010 now U.S. Pat. No. 8,438,358;

which is a Continuation-in-Part of a pending application entitled, SYSTEM-ON-CHIP WITH THERMAL MANAGEMENT CORE, invented by Waseem Kraipak et al., Ser. No. 12/687,817, filed Jan. 14, 2010;

which is a Continuation-in-Part of a pending application entitled, SYSTEM-ON-CHIP WITH FEEDBACK LOOP FOR PROCESSOR FREQUENCY CONTROL, invented by Waseem Kraipak et al., Ser. No. 12/639,064, filed Dec. 16, 2009. All the above-referenced applications are incorporated herein by reference.

BACKGROUND OF THE INVENTION

1. Field of the Invention

This invention generally relates to system-on-chip (SoC) off-SoC memory management and, more particularly, to a system and method for using a SoC hardware core to prefetch the data from a shutdown memory, being temporarily stored in a combination of slower memories, and using a hierarchy of memories and cache to attain power savings with nearly the speed of the shutdown memory.

2. Description of the Related Art

As noted in Wikipedia, a memory controller is a digital circuit that manages the flow of data going to and from the main memory. The memory controller can be a separate chip or integrated into another chip, such as on the die of a microprocessor. Computers using Intel microprocessors have conventionally had a memory controller implemented on their motherboard's Northbridge, but some modern microprocessors, such as DEC/Compaq's Alpha 21364, AMD's Athlon 64 and Opteron processors, IBM's POWER5, Sun Microsystems UltraSPARC T1, and more recently, Intel Core i7 have a memory controller on the microprocessor die to reduce the memory latency. While this arrangement has the potential of increasing system performance, it locks the microprocessor to a specific type (or types) of memory, forcing a redesign in order to support newer memory technologies. When the memory controller is not on-die, the same CPU may be installed on a new motherboard, with an updated Northbridge.

The integration of the memory controller onto the die of the microprocessor is not a new concept. Some microprocessors in the 1990s such as the DEC Alpha 21066 and HP PA-7300LC had integrated memory controllers, but to reduce the cost of systems by removing the requirement for an external memory controller instead of increasing performance.

Memory controllers contain the logic necessary to read and write dynamic random access memory (DRAM), and to "refresh" the DRAM by sending current through the entire device. Without constant refreshes, DRAM loses the data written to it as the capacitors leak their charge within a fraction of a second (not less than 64 milliseconds according to JEDEC standards).

Reading and writing to DRAM is facilitated by use of multiplexers and demultiplexers, by selecting the correct row and column address as the inputs to the multiplexer circuit, where the demultiplexer on the DRAM can select the correct memory location and return the data (once again passed through a multiplexer to reduce the number of wires necessary to assemble the system).

Bus width is the number of parallel lines available to communicate with the memory cell. Memory controller bus widths range from 8-bit in earlier systems, to 512-bit in more complicated systems and video cards. Double data rate (DDR) memory controllers are used to drive DDR SDRAM, where data is transferred on the rising and falling edges of the memory clock. DDR memory controllers are significantly more complicated than Single Data Rate controllers, but allow for twice the data to be transferred without increasing the clock rate or increasing the bus width to the memory cell.

Dual channel memory controllers are memory controllers where the DRAM devices are separated onto two different buses, allowing two memory controllers to access them in parallel. This dual arrangement doubles the theoretical amount of bandwidth of the bus. In theory, more channels can be built (a channel for every DRAM cell would be the ideal solution), but due to wire count, line capacitance, and the need for parallel access lines to have identical lengths, more channels are very difficult to add.

Fully buffered memory systems place a memory buffer device on every memory module (called an FB-DIMM when Fully Buffered RAM is used), which unlike conventional memory controller devices, use a serial data link to the memory controller instead of the parallel link used in previous RAM designs. This decreases the number of the wires necessary to place the memory devices on a motherboard (allowing for a smaller number of layers to be used, meaning more memory devices can be placed on a single board), at the expense of increasing latency (the time necessary to access a memory location). This latency increase is due to the time required to convert the parallel information read from the DRAM cell to the serial format used by the FB-DIMM controller, and back to a parallel form in the memory controller on the motherboard. In theory, the FB-DIMM's memory buffer device could be built to access any DRAM cells, allowing for memory cell agnostic memory controller design, but this has not been demonstrated, as the technology is in its infancy.

A DIMM, or dual in-line memory module, comprises a series of dynamic random access memory integrated circuits. These modules are mounted on a printed circuit board and designed for use in personal computers, workstations and servers. DIMMs began to replace SIMMs (single in-line memory modules) as the predominant type of memory module as Intel's Pentium processors began to gain market share.

The main difference between SIMMs and DIMMs is that DIMMs have separate electrical contacts on each side of the module, while the contacts on SIMMs on both sides are redundant. Another difference is that standard SIMMs have a 32-bit data path, while standard DIMMs have a 64-bit data path. Since Intel's Pentium has (as do several other processors) a 64-bit bus width, it requires SIMMs installed in matched pairs in order to complete the data bus. The processor would then access the two SIMMs simultaneously. DIMMs were introduced to eliminate this practice.

Serial ATA (SATA) is a computer bus interface for connecting host bus adapters to mass storage devices such as hard disk drives and optical drives. Serial ATA was designed to replace the older ATA (AT Attachment) standard (also known as EIDE). It is able to use the same low level commands, but serial ATA host-adapters and devices communicate via a high-speed serial cable over two pairs of conductors. In contrast, the parallel ATA (the redesignation for the legacy ATA specifications) used 16 data conductors each operating at a much lower speed. SATA offers several compelling advantages over the older parallel ATA (PATA) interface: reduced cable-bulk and cost (reduced from 80 wires to seven), faster and more efficient data transfer, and hot swapping.

The SATA host adapter is integrated into almost all modern consumer laptop computers and desktop motherboards. As of 2009, SATA has mostly replaced parallel ATA in all shipping consumer PCs. PATA remains in industrial and embedded applications dependent on Compactflash storage although the new CFast storage standard will be based on SATA.

Flash memory is a non-volatile computer storage that can be electrically erased and reprogrammed. It is a technology that is primarily used in memory cards and USB flash drives for general storage and transfer of data between computers and other digital products. It is a specific type of EEPROM (Electrically Erasable Programmable Read-Only Memory) that is erased and programmed in large blocks; in early flash the entire chip had to be erased at once. Flash memory costs far less than byte-programmable EEPROM and therefore has become the dominant technology wherever a significant amount of non-volatile, solid state storage is needed. Example applications include PDAs (personal digital assistants), laptop computers, digital audio players, digital cameras and mobile phones. It has also gained popularity in console video game hardware, where it is often used instead of EEPROMs or battery-powered static RAM (SRAM) for game save data.

Since flash memory is non-volatile, no power is needed to maintain the information stored in the chip. In addition, flash memory offers fast read access times (although not as fast as volatile DRAM memory used for main memory in PCs) and better kinetic shock resistance than hard disks. These characteristics explain the popularity of flash memory in portable devices. Another feature of flash memory is that when packaged in a "memory card," it is extremely durable, being able to withstand intense pressure, extremes of temperature, and even immersion in water.

Although technically a type of EEPROM, the term "EEPROM" is generally used to refer specifically to non-flash EEPROM which is erasable in small blocks, typically bytes. Because erase cycles are slow, the large block sizes used in flash memory erasing give it a significant speed advantage over old-style EEPROM when writing large amounts of data.

In summary, DIMMs are fast, consume relatively large amounts of power, and have a high bit density. Flash memories are slower than DIMMs, but faster than SATA or SSDs (solid state drives), consume less power, and have a lower memory density. SATA are mechanical, making them the slowest memory. They burn more power than a DIMM when active. However, a SATA drive has lots of storage and can be turned on and off, to save power, without losing data.

As noted above, most computing devices are currently built using DIMM type RAM memories. There are many occasions when a computing device is turned on, but not accessing memory. Keeping the DIMM memory "alive" in these conditions is wasteful of power. The power issue can be especially critical if the computing device is battery operated or sensitive to high operating temperatures. Currently, there is no technology able to shutdown or replace memory devices on-the-fly. Some problems that prevent such an operation include the possibility of data corruption, operating system inflexibility, and signal integrity or electrostatic discharge (ESD) issues. Even in the case when the operating system (OS) is hibernating, DIMMs cannot be removed, as the OS and the basic input/output system (BIOS) always look for the exact same memory state that existed prior to hibernation.

It would be advantageous if at least some of a computer device's memories could be put into a sleep mode when the system determines limited memory read/write access is required.

It would be advantageous if data from a shutdown memory could be written into cache when there is a high likelihood that is to be requested by a processor.

SUMMARY OF THE INVENTION

Described herein is a technique to shutdown a memory module on-the-fly, permitting a user to extend the runtime of the system while running on a battery. This situation may occur, for example, when the user is traveling or making a presentation. This memory shutdown may even be used when the user is running Office applications, such as Word or PowerPoint, or checking emails, since these applications do not necessarily need access to the full memory.

The user can shut down one of the memory modules for deep power saving purpose and extended battery life. For instance, if the user is traveling and they know that they will be working mostly on the Office applications (MsWord, Excel, PowerPoint, or emails) and need to extend battery life. The user can click a hot key meant for deep power saving, which shuts down one of the memory modules on-the-fly. The system continues working with only one memory module without taking much of a performance hit. The machine does not need to be rebooted or the applications restarted. The memory shutdown happens in the background.

Otherwise a thermal control unit monitoring the memory modules may detect that there is a frequent heating issue with one of the memories that is not responding to initial thermal controls. In this case, data can be moved out of the problem memory module, and that memory shut down until it properly cools. After cooling, the memory module can be brought back online.

If there is a constant thermal issue with a particular memory module, or some other malfunction, the memory module can be shut down and replaced with a new memory module while the system is still in operation. There is no data loss, as the data is moved to a dedicated auxiliary storage location (flash, HDD, or Solid State Drive (SSD)). This feature is important for mission critical systems that need to have a 99.99999% uptime.

Also described is a technique to prefetch data from the SATA or a flash device and copy it to a SoC embedded cache. When the processor requests data from a shutdown memory, the linked list map determines the status of the address, i.e. if the data is in the cache, flash, or SATA drive. Then, data related to the requested data (e.g., data with proximal addresses) is loaded into cache (if not already present), in case it is subsequently requested.

Accordingly, a method is provided for using a system-on-chip (SoC) memory manager to optimize the use of off-chip memory modules. A SoC is provided with a processor, a memory controller core interfaced to an external random access memory (RAM) first memory module, and a memory switching core interfaced to an external second memory module. In use, the memory controller may receive a request for a first data block, subsequent to shutting the first memory down, and determine that the first data block is stored in the first memory. The memory switching core uses a memory map to translate the first data block address in the first memory module to a first data block address in the second memory module. If the first data block is present in the cache, the first data block is supplied on the SoC data bus from the cache. Then, the cache is loaded with a plurality of data blocks from a corresponding plurality of addresses in the second memory module, associated with the first data block address.

If the first data block is not in cache, the memory switching core accesses the memory map to determine the first data block location. If the first data block is in a second memory flash, it is transferred to cache. If the first data block is in the bulk memory (e.g., a solid state drive (SSD) or serial advanced technology attachment (SATA) memory), the first data block is transferred to both cache and flash memory (if flash is present), and the memory map is updated with the location of the first data block in the cache and flash memories.

Additional details of the above-described method, and a SoC with a memory management system to optimize the use of off-SoC memories, are provided below.

DETAILED DESCRIPTION

Figure 1:
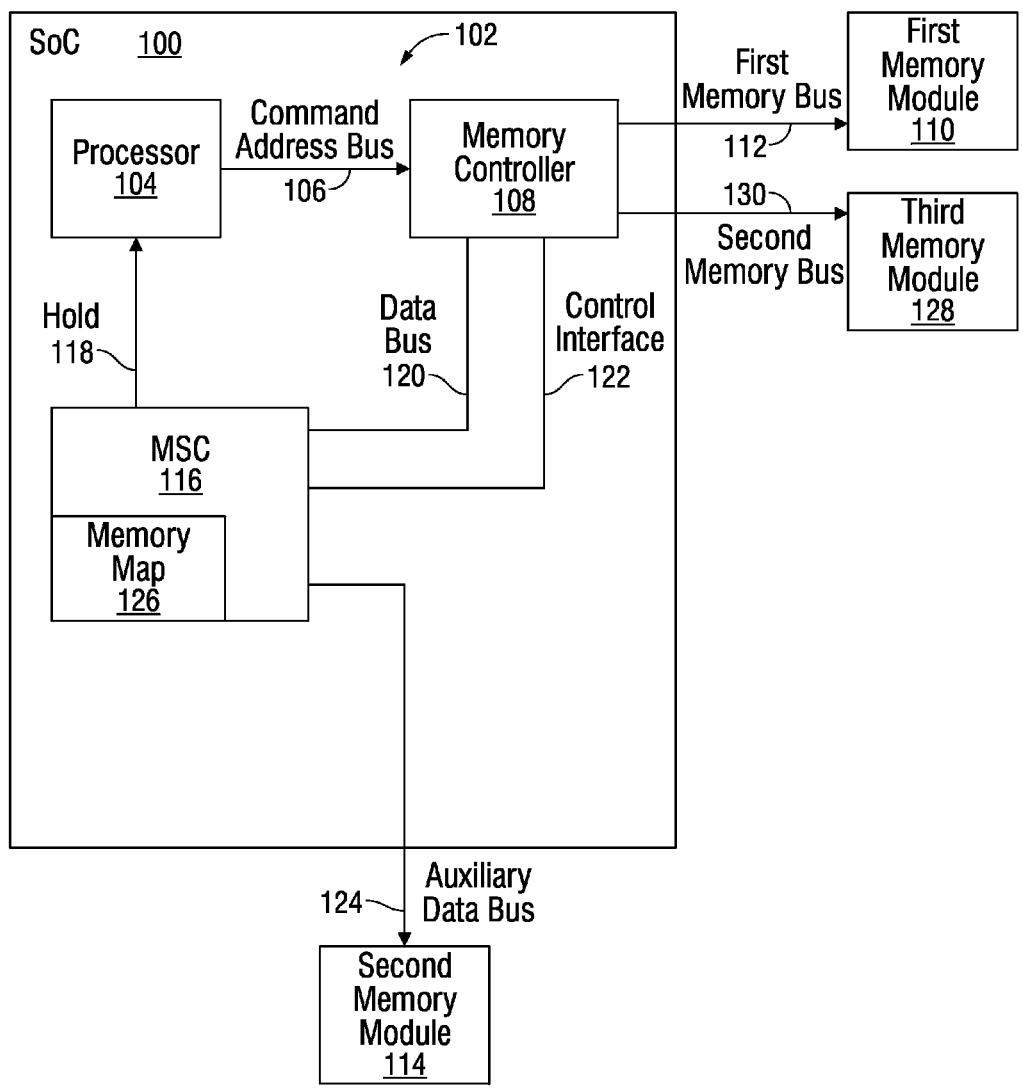
FIG. 1 is a schematic block diagram of a system-on-chip (SoC) with a memory management system to dynamically shutdown, restart, and optimize the use of off-chip memory modules.

FIG. 1 is a schematic block diagram of a system-on-chip (SoC) with a memory management system to dynamically shutdown, restart, and optimize the use of off-chip memory modules. The memory management system 102 comprises a processor 104 connected to a command address bus on line 106. A memory controller 108 is interfaced to the processor 104 via the command address bus on line 106. An external (off-SoC) random access memory (RAM) first memory module 110 is interfaced to the memory controller 108 via a first memory bus on line 112. The system 102 also comprises an external (off-SoC) (typically low power consumption) second memory module 114. A memory switching core 116 has a hold interface on line 118 connected to the processor 104. The memory switching core (MSC) 116 is connected to the memory controller 108 via a data bus on line 120 and control interface on line 122. The MSC 116 is connected to the second memory module 114 via an auxiliary data bus on line 124. The MSC 116 is enabled as a hardware device.

The memory switching core 116 asserts a hold on processor operations in response to enacting a memory switch operation and desserts the hold when the memory switch operation is completed. The memory switching core 116 commands the transfer of data from a source memory module to a destination memory module. The data transfer operations can be either a shutdown or restart operation. A shutdown operation transfers data from the first memory module source 110 to the second memory module destination 114. The restart operation transfers data from the second memory module source 114 to the first memory module destination 110. A memory map 126 embedded in the memory switching core 116 translates the data addresses in the source memory module to data addresses in the destination memory module.

In one aspect as shown, an external (off-SoC) RAM third memory module 128 is connected to the memory controller 108 via a second memory bus on line 130. If memory switching core 116 enacts a shutdown operation (of the first memory module 110), the memory controller 108 changes processor memory access from interleaved access to the first memory module 110 and third memory module 128, to sequential access to the third memory module 128.

Alternately, if the memory switching core determines that a shutdown operation is desired, but that only the first memory module is interfaced to the memory controller (e.g., the third memory module is not present or not connected), the memory switching core 116 delivers a set of slow-operation parameters to the memory controller 108, to replace an initial set of parameters. Then, the memory controller 108 manages the first memory module 110 using the delivered set of parameters. One or more of the following memory control parameters may be delivered: column address strobe (CAS) latency (tAAmin), row address strobe (RAS) to CAS delay (tRCDmin), active to precharge delay time (tRAS min), active to active refresh delay time (tRC min), and combinations of the above-mentioned parameters. These parameters are well understood in the art. Details of a system able to change memory operation parameters are provided in parent application Ser. No. 12/729,210, which is incorporated herein by reference.

Figure 2:
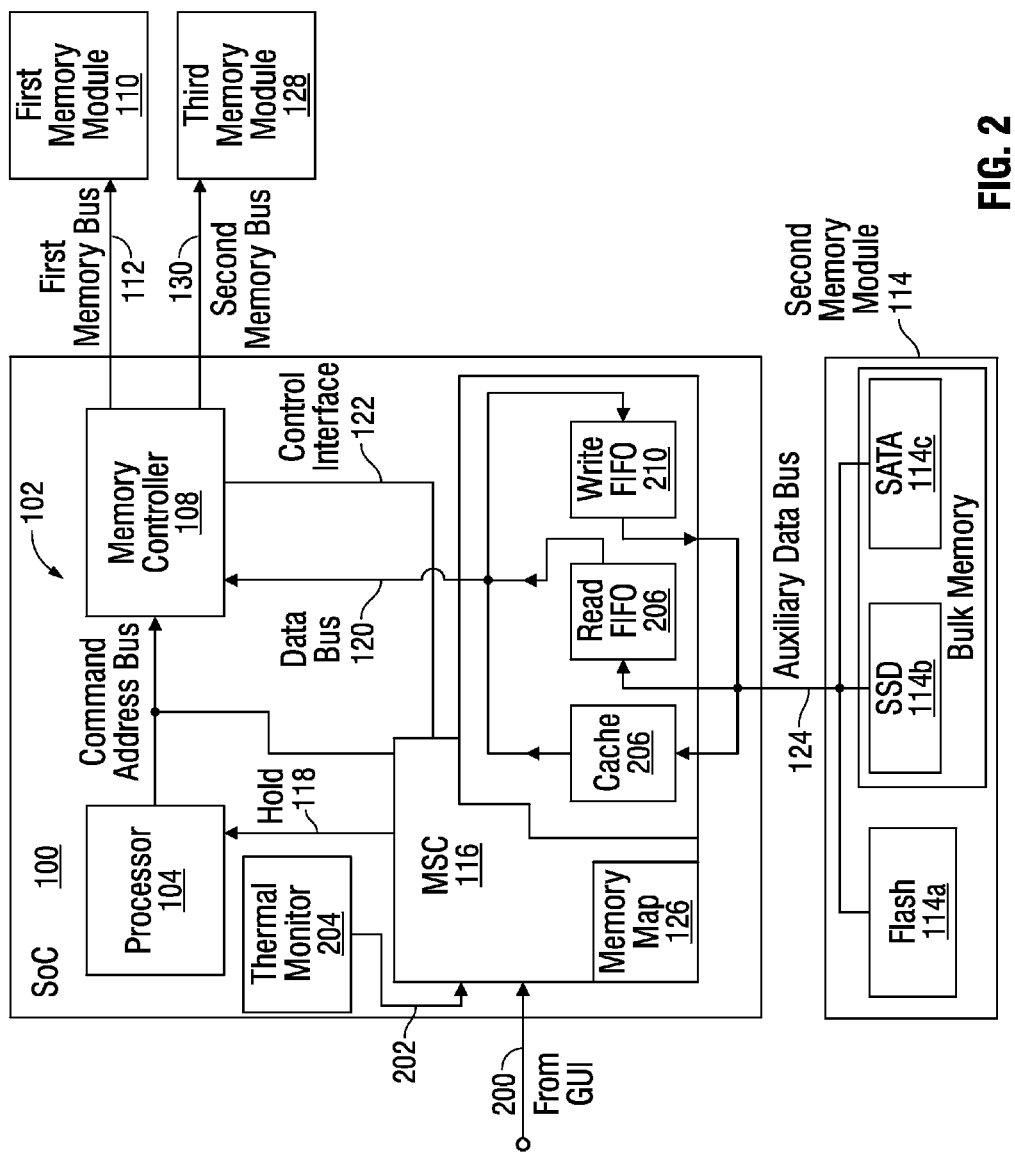
FIG. 2 is a schematic block diagram depicting additional details of the system presented in FIG. 1.

FIG. 2 is a schematic block diagram depicting additional details of the system presented in FIG. 1. In this aspect the second memory module 114 includes a flash memory 114a, a solid state drive (SSD) 114b, a serial advanced technology attachment (SATA) memory 114c. Although three memory components are shown connected in parallel on the auxiliary bus 124, it should be understood that the second memory module may comprise just one of the depicted modules, or any combination of the above-mentioned devices. In a shutdown operation, the memory switching core 116 transfers data to the second memory 114 by determining the capacity of the first memory module 110. If the capacity of the first memory module 110 is greater than the flash memory capacity 114a, it transfers the data to either the SSD memory 114b (if present) or the SATA memory 114c (if present). But if the capacity of the first memory module 110 is less than the flash memory 114a capacity, the MSC 116 can transfer the data to the flash memory. As noted above in the Background, a flash memory conventionally uses less energy than SATA or SSD. Note: the decision to transfer data to a particular module need not necessarily be made on the basis of capacity. Power consumption is another factor to be considered.

In another aspect the memory switching core 116 has a command interface, and the MSC enacts the shutdown operation in response to receiving a trigger message from a graphical user interface (GUI) connected to the SoC on line 200. The GUI, not shown, is typically a software application of instructions stored in a computer readable memory that are executed by a processor. The trigger message may also be supplied on line 202 as a thermal warning from an SoC-embedded thermal monitor 204. Details of a thermal monitoring system are provided in parent application Ser. No. 12/687,817, which is incorporated herein by reference. Alternately, the trigger can be an error detection message on line 122 from the memory controller 108, or from a software application (not shown) enabled as a sequence of instructions, stored in memory, and executed by a processor.

Subsequent to the hold being deasserted on the processor 104, the processor is still able to access data originally stored in the first memory module 110, even after the first memory module has been shut down. Thus, if the memory controller 108 receives a request from the processor 104 for a first data block in the first memory module 110, the memory switching core 116 uses the memory map 126 to translate the first data block address in the first memory module 110 to a first data block address in the second memory module 114. The MSC 116 then accesses the second memory module 114, and supplies the first data block on the data bus 120.

Typically, a cache 206 is embedded in the memory switching core 116. The memory switching core 116 initially checks for the first data block in the cache 206, and if the first data block is present in the cache, it supplies the first data block on the data bus 120 from the cache. Then, the memory switching core 116 loads the cache 206 with data blocks associated with a first plurality of addresses in the second memory module 114.

A read first-in first-out (FIFO) 208 may also be embedded in the memory switching core 116, interposed between the data bus 120 and auxiliary bus 124. If the first data block is not in cache 206, the memory switching core 116 supplies the first data block on the data bus by accumulating portions of the first data block in the read FIFO 208 and transferring the accumulated portions from the read FIFO to the data bus 120 (and to the cache 206 so that subsequent fetches can be served by the cache).

Subsequent to the first memory module shutdown and the hold being deasserted on the processor 104, the memory controller 108 may receive a request from the processor 104 to write a second data block in the first memory module 110. The memory switching core 116 saves the second data block in the second memory module 114 and uses the memory map 126 to translate the second data block address in the second memory module 114 to a second data block address in the first memory module 110.

In one aspect, a write FIFO 210 is embedded in the memory switching core 116, interposed between the data bus 120 and auxiliary bus 124. The memory switching core 116 saves the second data block in the second memory module 114 by accumulating portions of the second data block in the write FIFO 210 and transfers the accumulated portions from the write FIFO 210 to the second memory module 114.

The system depicted in FIG. 2 may also be described as one that optimizes the use of off-chip memory modules. If the memory controller 108 receives a request for a first data block, subsequent to shutting the first memory 110 down, and determines that the first data block is stored in the first memory, then the memory switching core 116 uses the memory map 126 to translate the first data block address in the first memory module 110 to a first data block address in the second memory module 114. If the first data block is present in the cache 206, the first data block is supplied on the SoC data bus 120 from the cache. Then, the cache 206 is loaded with a plurality of data blocks from a corresponding plurality of addresses in the second memory module 114, associated with the first data block address. For example, the data blocks loaded into cache may be the next-in-sequence addresses to the first data block. Alternately, there may be pointer associated with the first data block address that directs the MSC 116 to the next address(es) to be loaded.

If the first data block is not in cache 206, the memory switching core 116 accesses the memory map 126 to determine the first data block location, and transfers the first data block to cache if the first data block is in flash memory 114a. For convenience, the bulk memory 114b/114c is defined herein as components of the second memory that include a SSD 114d, a SATA 114c, or both a SSD and SATA. If the first data block is in the bulk memory 114b/114c, the memory switching core 116 also transfers the first data block to flash memory 114a (assuming a flash memory is present), and updates the memory map 126 with the location of the first data block in the cache 206 and flash 114a memories.

The memory switching core 116 loads the cache 206 with data blocks from the second memory module 114 by setting a limit value equal to n and a counter value equal to 0. The MSC 116 determines if the next address is in cache 206, and if so, increments the counter. The MSC iteratively determines if the next address is in cache until the counter is equal to n. If it is determined that the next address is not in cache, the MSC 116 accesses the memory map 126 to determine the location of the next address in the second memory module 114. If the next address is in the flash memory 114, the next data block associated with the next address is transferred to cache 206, the counter is incremented, and a determination is made if the next address is in cache. This method is iteratively repeated until the counter is equal to n.

If the next address is in the bulk memory, the next data block associated with the next address is transferred to cache 206 and to flash memory (if present). The memory map 126 is updated with the location of the next data block in the cache and flash memories, the counter is incremented, and a determination is made if the next address is in cache 206. This process is iteratively repeated until the counter is equal to n.

The access of data from the second memory 114 is premised upon the assumption that the data has previously been moved from the first memory 110 to the second memory 114, and the first memory shut down. More explicitly, the memory switching core 116 asserts a hold on processor operations prior to receiving the request for the first data block, and in a shutdown operation, transfers data from the first memory module 110 to the second memory module 114. The memory map is used for translating the data addresses in the first memory module to data addresses in the second memory module. After the data transfer, the MSC 116 deasserts the hold on processor operations.

As part of the shut down operation, the memory switching core 116 determines the capacity of the first memory module 110, and transfers the data to the bulk memory 114b/114c if the capacity of the first memory module is greater than the flash memory 114a capacity. However, the data is transferred to the flash memory 114a if the capacity of the first memory module 110 is less than the flash memory capacity.

If the memory controller 108 receives a request for a second data block, and determines that the second data block is stored in the still active (not shut down) third memory 128, the request for the second data block is passed to the third memory. Alternately, the MSC may make the determination.

As used in this application, the term "core" refers to an integrated circuit die of connected hardware sub-components that supply electrical signals in response to electrical signal stimuli. While these electrical signals may be indirectly affected by software operations performed external to die, there is no software application internal to the die indirectly generating electrical signals. Any logic functions performed internal to the core are the result of a hardware-based state machine type logic.

Functional Description

Figure 3:
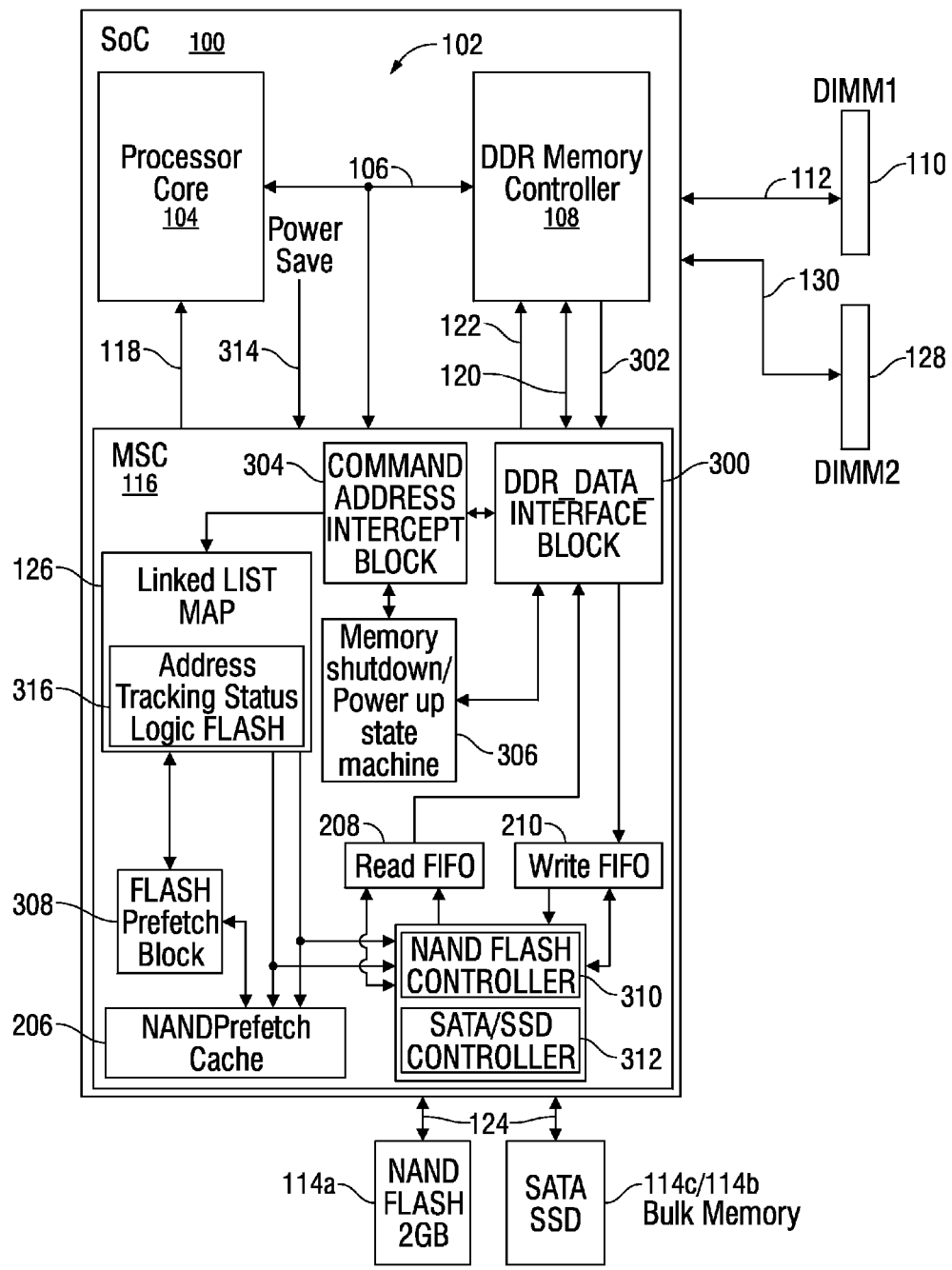
FIG. 3 is a schematic block diagram depicting additional details of the system presented in FIG. 2.

FIG. 3 is a schematic block diagram depicting additional details of the system presented in FIG. 2. A double data rate (DDR) controller 108 is connected to two DIMMS, 110 and 128. For clarity, memory controller 108 is shown as one block but it actually contains two sub-blocks, one dedicated to each DIMM. The DDR memory controller 108 is connected with the DDR_data-interface block 300, with interfaces cntrl1 122, data-bus 120, and transaction done 302 signals.

The command/address intercept block 304 intercepts the DDR command and address on line 106, and monitors commands between the processor and memory controller. The memory shutdown/power up state machine 306 is the main state machine. It has the function of shutting down a memory module and also bringing it back up.

The linked list map 126 remaps the physical addresses of the memory module that has been shut down to the flash memory, SATA, or SSD address space. The link list map also indicates whether an address that is being translated can be found in the prefetch cache 206. The flash prefetch block 308 moves data from the second memory 114 to the prefetch cache 206 before the read request for that block comes from the core 104. The NAND flash controller 310 controls the data movement to and from the NAND flash 114a. It should be noted that the flash memory type is not limited to NAND flash and can be NOR flash as well. SATA/SSD controller 312 controls data flow to and from the SATA and SSD memories (bulk memory) 114c/114b.

Figure 4:
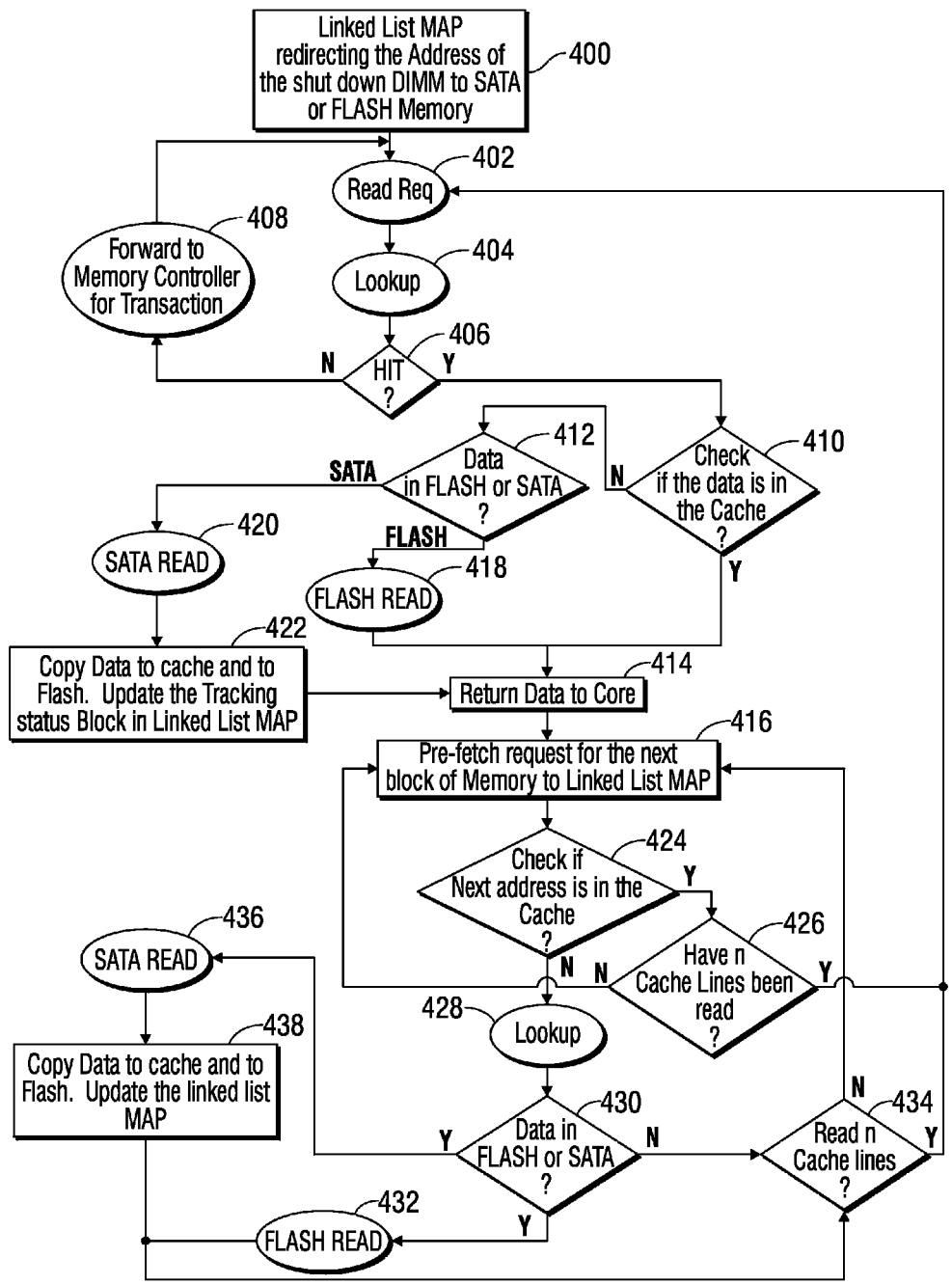
FIG. 4 is a detailed flowchart illustrating a process for moving data to more accessible memory.

FIG. 4 is a detailed flowchart illustrating a process for moving data to more accessible memory. Considering both FIGS. 3 and 4, it is assumed that two DIMMs populate the Board, and one DIMM (e.g., 110) has been shut down. Any request targeted for that DIMM is honored by the MSC and linked list map 126, Step 400. The processor core 104 requests data from the memory controller 108 in Step 402. The targeted address lies in the address space of the first DIMM 110, which has been shut down. The linked list map 126 intercepts all memory requests going to the memory controller 108. The linked list map 126 contains an address tracker linked-list that denotes whether the addresses are stored in bulk memory 114b/114c, flash memory 114a, or reside in the prefetch cache 206.

The dedicated MSC 116 hardware performs a lookup (Step 404) for the address and generates a HIT or MISS for that address in Step 406. If the address is for the active DIMM 128, the request is passed on to the memory controller 108 in Step 408. A HIT means that data for this address ranges is not stored in the active main memory (DIMM) and that it is either stored in the NAND cache 206, SATA/SSD 114c/114b, or flash memory 114c. There are other lookups performed in Steps 410 and 412 to determine in which of the three areas the data is stored. If the linked list map indicates that the data is stored in the cache 206, the data is read and returned to the core 104 in Step 414. After this, the linked list map generates an internal prefetch request in Step 416. This request is intended to check if the next x blocks of memory requests are in the flash, cache, or bulk memory drives.

If Step 410 determines a cache MISS and Step 412 determines a flash read, the linked list map forwards the address to the flash controller and the controller reads the data in Step 418. This data is copied to the cache and in Step 414, forwarded to the core 104. The linked list map updates the address tracker with the data/address locations, and generates an internal prefetch request in Step 416. This request is intended to check if the next x blocks of memory requests are in the flash, cache, or in the bulk memory drive.

If Step 410 determines a cache MISS and Step 420 determines a bulk memory read, then the data for this address range is stored on the SATA or SSD drives. The linked list map forwards the address to the SATA (or SSD) controller and the data is read. In Step 422 the data is then copied into the cache 206 and flash 114a, and in parallel, forwarded to the core. The linked list address tracker register is updated accordingly to show that the data is stored in the cache as well as the flash. Having the data in both the cache and flash is efficient because the data can be evicted from the cache if it is not used. However, since the data still resides in flash, the latency associated with another SATA/SSD read is avoided. After this, the linked list map generates an internal prefetch request in Step 416. This request is intended to check if the next x blocks of memory requests are in the flash, cache, or in the bulk memory drive.

The cache has the fastest access, followed by flash access. The slowest access is that of the SATA or SSD drives. It is desirable to keep as much data as possible in the cache and flash so as to minimize the SATA/SSD accesses. The mechanism of copying the data from SATA/SSD drive to flash memory and on-silicon cache boosts the performance during read operations.

Following Step 416, the linked list map initiates copying of the next n blocks of data to cache in Step 424. The linked list map updates the address tracker linked list accordingly. If the next address is in cache, Step 426 determines if the n blocks of data have been read. If yes, the process returns to Step 402. If no, the process returns to Step 416. If Step 424 determines that the next address is not in cache, a lookup is performed in Step 428 and Step 430 determines if the address is in flash or bulk memory. If the address is in flash, the data is read in Step 432 and then Step 434 determines if all n cache lines have been read. If yes, the process returns to Step 402. If no, the process returns to Step 416. If Step 430 determines that the address is in bulk memory, Step 436 read the data block, Step 438 copies the data into cache and flash and updates the linked list map of addresses, and the process moves to Step 434.

The same methodology as described above could also be applied to a DIMM that is not shutdown, to improve the speed of HDD access. The result would be a power savings in that the number of times that the HDD is spun up is minimized by using the flash and on-die cache.

Figure 5A:
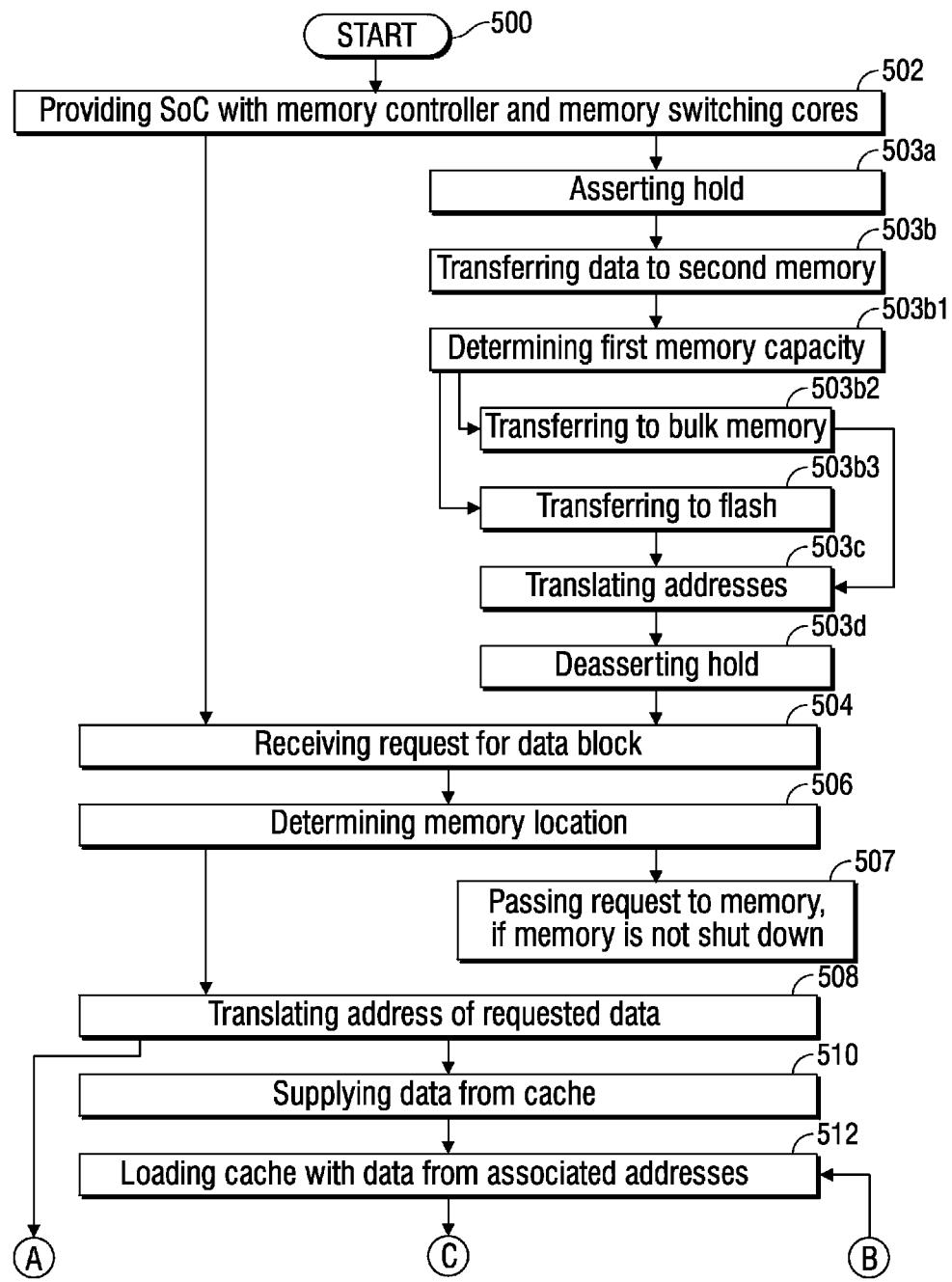
FIGS. 5A and 5B are flowcharts illustrating a method for using a SoC memory manager to optimize the use of off-chip memory modules.
Figure 5B:
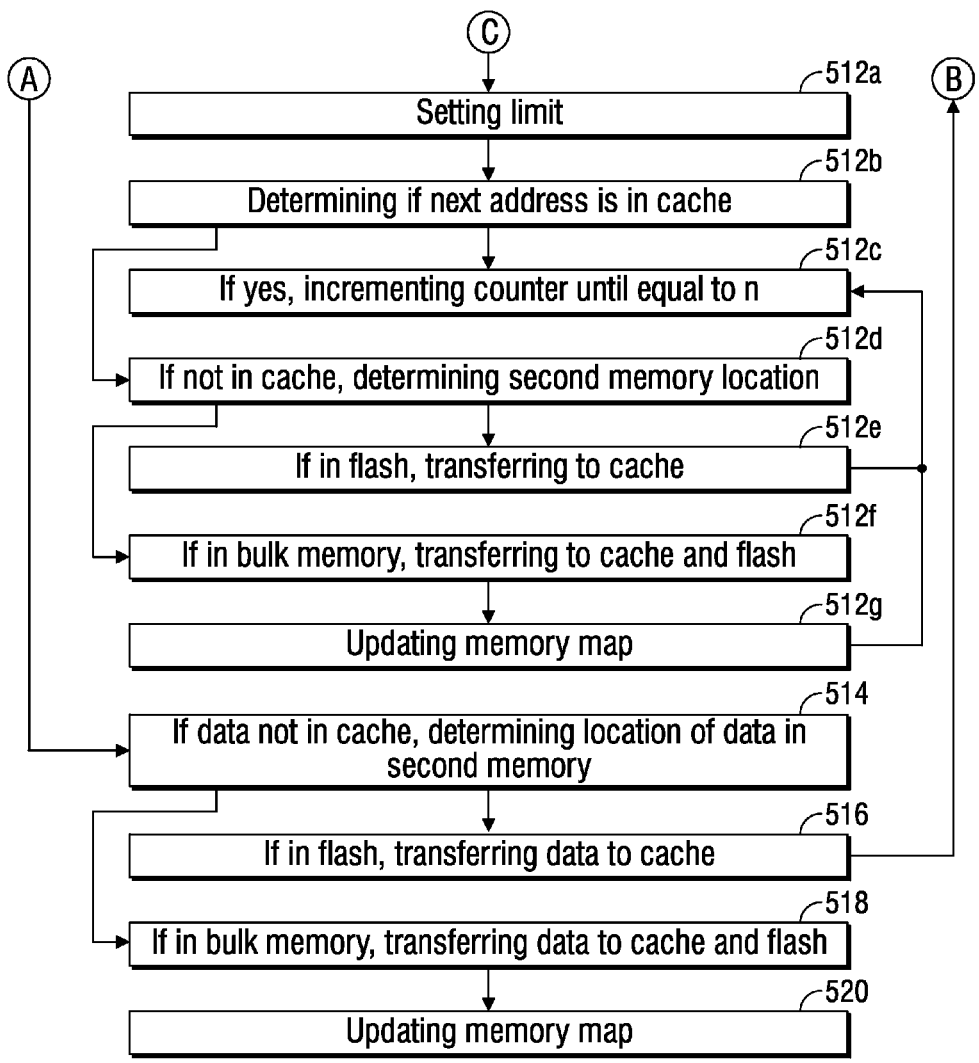

FIGS. 5A and 5B are flowcharts illustrating a method for using a SoC memory manager to optimize the use of off-chip memory modules. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 500.

Step 502 provides a SoC with a processor, a memory controller core interfaced to an external RAM first memory module, and a memory switching core interfaced to an external second memory module. In Step 504 the memory controller receives a request for a first data block, subsequent to shutting the first memory down. In Step 506 the memory controller determines that the first data block is stored in the first memory. In Step 508 the memory switching core uses a memory map to translate the first data block address in the first memory module to a first data block address in the second memory module. If the first data block is present in the cache, Step 510 supplies the first data block on the SoC data bus from the cache. Step 512 loads the cache with a plurality of data blocks from a corresponding plurality of addresses in the second memory module, associated with the first data block address.

In one aspect, loading the cache with data blocks in Step 512 includes loading data blocks from a flash memory, and/or a bulk second memory module, where the bulk memory can be a SSD and/or a SATA memory. If the first data block is not in cache, Step 514 accesses the memory map to determine the first data block location. If the first data block is in flash memory, Step 516 transfers the first data block to cache. If the first data block is in the bulk memory, Step 518 transfers the first data block to cache and flash memory (if present), and Step 520 updates the memory map with the location of the first data block in the cache and flash memories.

In another aspect, loading the cache with data blocks in Step 512 includes the following substeps. Step 512a sets a limit value equal to n and a counter value equal to 0. Step 512b determines if the next address is in cache. If so, Step 512c increments the counter and determines if the next address is in cache until the counter is equal to n. If Step 512b determines that the next address is not in cache, Step 512d accesses the memory map to determine the location of the next address in the second memory module. If the next address is in the flash memory, Step 512e transfers a next data block associated with the next address to cache, and then Step 512c increments the counter and determines if the next address is in cache until the counter is equal to n. If the next address is in the bulk memory, Step 512f transfers a next data block associated with the next address to cache and flash memory (if present). Then, Step 512g updates the memory map with the location of the next data block in the cache and flash memories, and Step 512c increments the counter and determines if the next address is in cache until the counter is equal to n.

In a different aspect, prior to receiving the request for the first data block in Step 504, the memory switching core asserts a hold on processor operations in Step 503a. In a shutdown operation, Step 503b transfers data from the first memory module source to the second memory module. In Step 503c the memory switching core uses the memory map for translating the data addresses in the first memory module to data addresses in the second memory module. Then in Step 503d the memory switching core deasserts the hold on processor operations.

In one aspect, transferring data in Step 503b includes the following substeps. Step 503b1 determines the capacity of the first memory module. If the capacity of the first memory module is greater than the flash memory capacity, Step 503b2 transfers the data to the bulk memory. If the capacity of the first memory module is less than the flash memory capacity, Step 503b3 transfers the data to the flash memory.

In another aspect, providing the SoC with the memory controller core in Step 502 additionally includes providing the memory controller core interfaced to an external active RAM third memory module via a third memory bus. In Step 504 the memory controller core receives a request for a second data block, and in Step 506 the memory controller core determines that the second data block is stored in the third memory. In Step 507 the memory controller core passes the request for the second data block to the third memory. Alternately, the MSC may make the determination in Step 506.

A system and method have been provided for using a SoC memory manager to optimize the use of off-SoC memory modules. Examples of particular message structures, processors, and hardware units have been presented to illustrate the invention. However, the invention is not limited to merely these examples. Other variations and embodiments of the invention will occur to those skilled in the art.

We claim:

1. A method for using a system-on-chip (SoC) memory manager to optimize off-chip memory modules, comprising:
   receiving a request for a first data block at a memory controller, subsequent to shutting a first memory module down;
   determining that the first data block is stored in the first memory module;
   translating a first data block address in the first memory module to a second data block address in a second memory module via a memory map;
   if the first data block is present in a cache, supplying the first data block on a SoC data bus from the cache; and
   loading the cache with a plurality of data blocks from a corresponding plurality of addresses in the second memory module, associated with the first data block address, wherein the loading the cache further comprises
      setting a limit value equal to n and a counter value equal to 0;
      determining if a next address in the cache;
      if so, incrementing the counter and determining if the next address is in the cache until the counter is equal to n.

2. The method of claim 1 wherein loading the cache with data blocks associated with the plurality of addresses in the second memory module comprises loading data blocks from the second memory module selected from at least one of a flash memory, or a bulk memory;
   the method further comprising:
   if the first data block is not in the cache, accessing the memory map to determine a location of the first data block; and,
   if the first data block is in the flash memory, transferring the first data block to the cache.

3. The method of claim 2 further comprising:
   if the first data block is in the bulk memory, transferring the first data block to the cache;
   transferring the first data block to the flash memory; and,
   updating the memory map with the location of the first data block in the cache memory and the flash memory.

4. The method of claim 1 wherein loading the cache with data blocks from corresponding addresses in the second memory module further comprises:
   determining that the next address is not in the cache;
   accessing the memory map to determine a location of the next address in the second memory module;
   if the next address is in the flash memory, transferring a next data block associated with the next address to the cache; and,
   incrementing the counter and determining if the next address is in cache until the counter is equal to n.

5. The method of claim 4 wherein loading the cache with data blocks from corresponding addresses in the second memory module further comprises:
   if the next address is in the bulk memory, transferring a next data block associated with the next address to the cache;
   transferring the next data block to the flash memory;
   updating the memory map with a location of the next data block in the cache and flash memories; and,
   incrementing the counter and determining if the next address is in the cache until the counter is equal to n.

6. The method of claim 1 further comprising:
   asserting a hold on processor operations prior to receiving the request for the first data block;
   in a shutdown operation, transferring data from the first memory module to the second memory module;
   the memory switching core using the memory map for translating the data addresses in the first memory module to data addresses in the second memory module; and,
   deasserting the hold on processor operations.

7. The method of claim 6 wherein transferring data includes transferring data to the second memory module selected from a group consisting of a flash memory, and a bulk memory selected from a group consisting of a solid state drive (SSD), a serial advanced technology attachment (SATA) memory, and a combination of the above-mentioned memories, as follows:
  determining the capacity of the first memory module;
  if the capacity of the first memory module is greater than the flash memory capacity, transferring the data to the bulk memory; and,
  if the capacity of the first memory module is less than the flash memory capacity, transferring the data to the flash memory.

8. The method of claim 1,
further comprising:
receiving a request for a second data block;
determining that the second data block is stored in the third memory; and,
passing the request for the second data block to the third memory.

9. The method of claim 1, further comprising facilitating the using the system-on-chip (SoC) memory manager with a SoC with a processor, a memory controller core interfaced to an external random access memory (RAM) first memory module, and a memory switching core interfaced to an external second memory module.

10. A system-on-chip (SoC) comprising a memory management system to optimize the use of off-chip memory modules, the memory management system comprising:
  a processor connected to a command address bus;
  a memory controller interfaced to the processor via the command address bus;
  a first memory module interfaced to the memory controller via a first memory bus, wherein the first memory module is an external random access memory;
  an external second memory module;
  a cache memory;
  a memory switching core having a hold interface connected to the processor, a data bus and control interface connected to the memory controller, and an auxiliary data bus connected to the second memory module and cache memory;
  a memory map embedded in the memory switching core;
  wherein the memory controller is configured for receiving a request for a first data block, subsequent to shutting the first memory down, and is further configured for determining that the first data block is stored in the first memory; and,
  the memory switching core is configured for using the memory map to translate an address of the first data block in the first memory module to a second data block address in the second memory module, and if the first data block is present in the cache, supplying the first data block on the SoC data bus from the cache, and loading the cache with a plurality of data blocks from a corresponding plurality of addresses in the second memory module, associated with the first data block address, and
  the memory switching core is further configured for loading the cache with data blocks from the second memory module by setting a limit value equal to n and a counter value equal to 0, determining if the next address is in the cache, and if so, incrementing the counter, and determining if the next address is in the cache until the counter is equal to n.

11. The memory management system of claim 10 wherein the second memory module is at least one of a flash memory, or a bulk memory; and the memory switching core is further configured for accessing the memory map to determine a location of the first data block if the first data block is not in the cache, and transferring the first data block to the cache if the first data block is in flash memory.

12. The memory management system of claim 11 wherein the memory switching core is configured for transferring the first data block to the flash memory if the first data block is in the bulk memory, and updating the memory map with the location of the first data block in the cache and flash memory.

13. The memory management system of claim 10 wherein the memory switching core is configured for loading the cache with data blocks associated with the second memory module by determining that the next address is not in the cache, accessing the memory map to determine the location of the next address in the second memory module, transferring a next data block associated with the next address to cache if the next address is in the flash memory, incrementing the counter, and determining if the next address is in cache until the counter is equal to n.

14. The memory management system of claim 13 wherein the memory switching core is configured for loading the cache with data blocks from the second memory module by transferring a next data block associated with the next address to cache if the next address is in the bulk memory, transferring the next data block to flash memory, updating the memory map with the location of the next data block in the cache and flash memories, incrementing the counter, and determining if the next address is in the cache until the counter is equal to n.

15. The memory management system of claim 10 wherein the memory switching core is configured for asserting a hold on processor operations prior to receiving the request for the first data block, and in a shutdown operation, transferring data from the first memory module to the second memory module, using the memory map for translating the data addresses in the first memory module to data addresses in the second memory module, and then deasserting the hold on processor operations.

16. The memory management system of claim 15 wherein the second memory module is selected from a group consisting of a flash memory, and a bulk memory selected from a group consisting of a solid state drive (SSD), a serial advanced technology attachment (SATA) memory, and a combination of the above-mentioned memories; and,
  the memory switching core is configured for determining the capacity of the first memory module, transferring the data to the bulk memory if the capacity of the first memory module is greater than the flash memory capacity, and transferring the data to the flash memory if the capacity of the first memory module is less than the flash memory capacity.

17. The memory management system of claim 10 further comprising:
  a third memory module interfaced to the memory controller core via a second memory bus, wherein the third memory module is another external active random access memory; and,
  wherein the memory controller is configured for receiving a request for a second data block, determining that the second data block is stored in the third memory, and passing the request for the second data block to the third memory.

18. The method of claim 11, wherein the bulk memory is at least one of a solid state drive or a serial advanced technology memory.

* * * * *